United States Patent
Bai et al.

(10) Patent No.: US 9,890,034 B2
(45) Date of Patent: Feb. 13, 2018

(54) CAVITY TYPE PRESSURE SENSOR DEVICE

(71) Applicant: NXP USA,INC., Austin, TX (US)

(72) Inventors: Zhigang Bai, Tianjin (CN); Zhijie Wang, Tianjin (CN); Jinzhong Yao, Tianjin (CN)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/364,273

(22) Filed: Nov. 30, 2016

(65) Prior Publication Data

US 2017/0362077 A1    Dec. 21, 2017

(51) Int. Cl.
| | | |
|---|---|---|
| *B81B 7/00* | (2006.01) | |
| *H01L 23/24* | (2006.01) | |
| *B81C 1/00* | (2006.01) | |
| *G01L 19/14* | (2006.01) | |
| *G01L 19/00* | (2006.01) | |
| *H01L 23/31* | (2006.01) | |

(52) U.S. Cl.
CPC ........ *B81B 7/0038* (2013.01); *B81C 1/00285* (2013.01); *G01L 19/0076* (2013.01); *G01L 19/141* (2013.01); *H01L 23/24* (2013.01); *H01L 23/3135* (2013.01); *B81B 2201/0264* (2013.01)

(58) Field of Classification Search
CPC .............. B81B 7/0038; B81C 1/00285; G01L 19/0076; G01L 19/141; H01L 23/24; H01L 23/28; H01L 23/31; H01L 23/3135; H01L 23/3157; H01L 23/3192; H01L 23/4928; H01L 23/498; H01L 23/49861; H01L 2924/16151; H01L 2924/17151; H01L 2224/7992
See application file for complete search history.

(56) References Cited

U.S. PATENT DOCUMENTS

| | | | |
|---|---|---|---|
| 4,314,225 | A | 2/1982 | Tominaga |
| 5,604,363 | A | 2/1997 | Ichihashi |
| 5,692,637 | A | 12/1997 | Hodge |
| 5,719,069 | A | 2/1998 | Sparks |
| 5,811,684 | A | 9/1998 | Sokn |
| 5,831,170 | A | 11/1998 | Sokn |
| 5,874,679 | A | 2/1999 | Sokn |
| 5,996,419 | A | 12/1999 | Sokn |
| 6,094,356 | A | 7/2000 | Fujisawa |
| 6,266,197 | B1 | 7/2001 | Glenn |
| 6,351,996 | B1 | 3/2002 | Nasiri |
| 6,401,545 | B1 | 6/2002 | Monk |
| 6,566,168 | B2 | 5/2003 | Gang |
| 6,900,531 | B2 | 5/2005 | Foong |
| 6,927,482 | B1 | 8/2005 | Klm |
| 7,014,888 | B2 | 3/2006 | McDonald |
| 7,462,940 | B2 | 12/2008 | Bauer |

(Continued)

*Primary Examiner* — Jose R Diaz
(74) *Attorney, Agent, or Firm* — Charles E. Bergere

(57) ABSTRACT

A semiconductor sensor device is assembled using a lead frame having a flag surrounded by lead fingers. A pressure sensor die is mounted on the flag and electrically connected to the leads. Prior to encapsulation, a pre-formed block of gel material is placed over the sensor region on the die. Encapsulation is performed and mold compound covers the pressure sensor die and the bond wires. Mold compound covering the gel block may be removed. Additionally, a trench may be formed around an upper portion of the gel block so that the lateral sides of the gel block are at least partially exposed.

6 Claims, 4 Drawing Sheets

(56) References Cited

U.S. PATENT DOCUMENTS

| | | |
|---|---|---|
| 7,469,590 B2 | 12/2008 | Fukuda |
| 7,549,344 B2 | 6/2009 | Yamamoto |
| 7,568,390 B2 | 8/2009 | Shizuno |
| 7,632,698 B2 | 12/2009 | Hooper |
| 7,673,519 B1 | 3/2010 | Fuhrmann |
| 7,705,242 B2 | 4/2010 | Winterhalter |
| 7,875,942 B2 | 1/2011 | Cortese |
| 7,886,609 B2 | 2/2011 | Lo |
| 8,359,927 B2 | 1/2013 | Hooper |
| 8,378,435 B2 | 2/2013 | Lo |
| 8,493,748 B2 | 7/2013 | Camacho |
| 8,686,550 B2 | 4/2014 | Mcdonald |
| 2002/0168795 A1 | 11/2002 | Schuumans |
| 2004/0014266 A1 | 1/2004 | Lino |
| 2004/0187977 A1 | 9/2004 | Matsui |
| 2004/0245320 A1 | 12/2004 | Fukagaya |
| 2005/0236644 A1 | 10/2005 | Getten |
| 2006/0185429 A1 | 8/2006 | Liu et al. |
| 2007/0023873 A1 | 2/2007 | Park |
| 2007/0298276 A1 | 12/2007 | Teshima |
| 2008/0050267 A1 | 2/2008 | Murai |
| 2009/0072399 A1 | 3/2009 | Terashima |
| 2009/0211784 A1 | 8/2009 | Grogl |
| 2012/0049300 A1 | 3/2012 | Yamaguchi |
| 2014/0374848 A1 | 12/2014 | Koh et al. |
| 2015/0054099 A1* | 2/2015 | Yow .................. H01L 23/24 257/417 |

\* cited by examiner

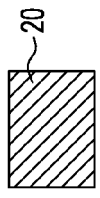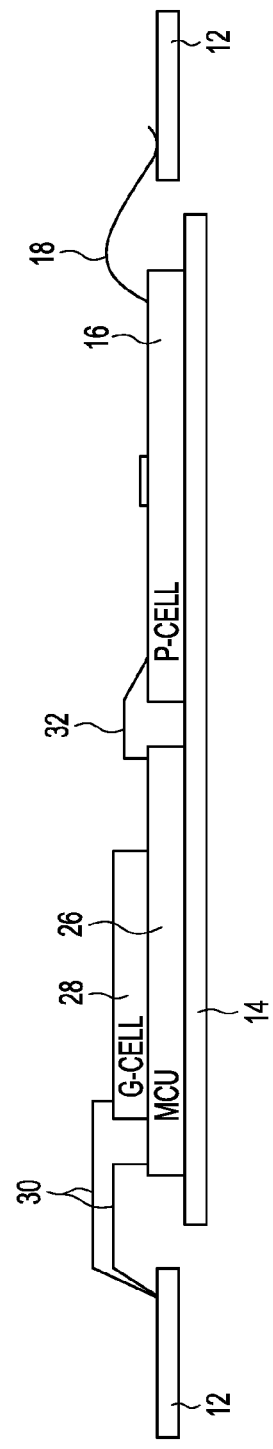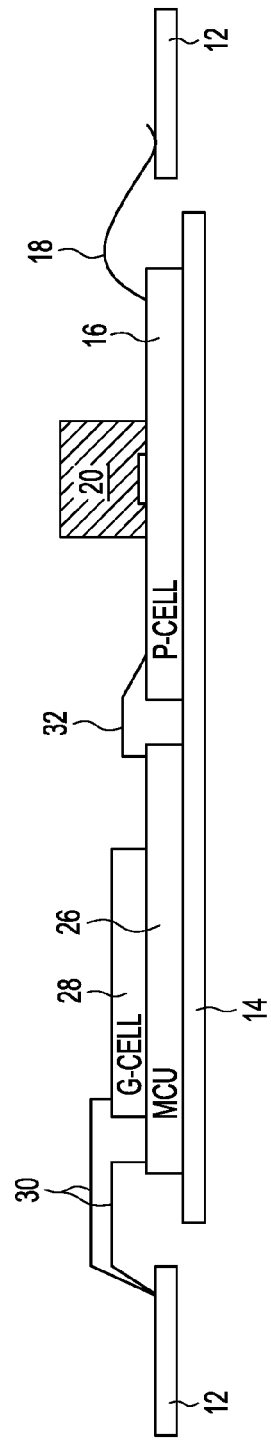
FIG. 3A
FIG. 3B
FIG. 3C

CAVITY TYPE PRESSURE SENSOR DEVICE

BACKGROUND

The present invention relates generally to semiconductor sensor devices and, more particularly to a cavity type pressure sensor device and a method of assembling same.

Semiconductor sensor devices, such as pressure sensors, are well known. Such devices use semiconductor pressure sensor dies. These dies are susceptible to mechanical damage during packaging and environmental damage when in use, and thus they must be carefully packaged. Further, pressure sensor dies, such as piezo resistive transducers (PRTs) and parameterized layout cells (P-cells), do not allow full encapsulation because that would impede their functionality.

Typical cavity style pressure sensing devices are assembled by placing a pressure sensing die in a pre-molded enclosure on a lead frame. The die is electrically connected to device leads (and/or other devices) with bond wires. A cavity is formed over the die by the enclosure, and the cavity is filled with silicone gel to protect the die. However, micro-gaps can be present at interfaces between the plastic molding material and the lead frame. Further, when the sensor device is exposed to high pressure and decompression, air bubbles can be formed inside the gel, which can interact with the bond wire interconnections and the MEMS structure of the die, causing device read errors.

Since the size of the pre-molded package cavity is typically large and the gel used to fill the cavity is expensive, it would be advantageous to be able to reduce the volume of gel material used to fill the cavity. It also would be advantageous to reduce the opportunity for bubble formation.

BRIEF DESCRIPTION OF THE DRAWINGS

Embodiments of the present disclosure are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIGS. 3A-3E are cross-sectional side views illustrating steps of a method of assembling a pressure sensor device in accordance with an embodiment of the present invention.

DETAILED DESCRIPTION

Figure 1A:
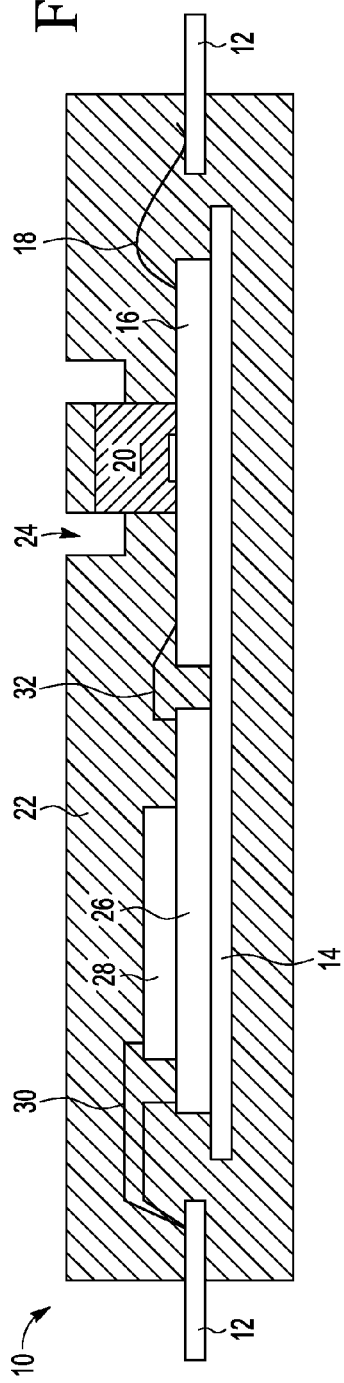
FIGS. 1A-1C are cross-sectional side views of various preferred embodiments of a pressure sensing device in accordance with the present invention.

Detailed illustrative embodiments of the present disclosure are disclosed herein. However, specific structural and functional details disclosed herein are merely representative for purposes of describing example embodiments of the present disclosure. Embodiments of the present disclosure may be embodied in many alternative forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a semiconductor sensor device including a lead frame having a plurality of leads and at least a first die flag surrounded by the leads, and a pressure sensor die attached to the flag. First bond wires electrically connect the pressure sensor die with first ones of the lead frame leads. A pre-molded block of gel material is disposed on and covers an active region of the pressure sensor die. A mold compound encapsulates the pressure sensor die, the first bond wires, and at least a portion of the gel block. In one embodiment, an upper surface of the gel block is flush with a top surface of the mold compound and the upper surface of the gel block is exposed to ambient atmospheric pressure outside the sensor device. In another embodiment, the upper surface of the gel block lies below the top surface of the mold compound. In yet another embodiment, a trench is formed around the gel block such that the lateral side walls of the gel block are at least partially exposed.

The present invention also provides a method for assembling a semiconductor sensor device, including the steps of attaching a pressure sensor die to a flag of a lead frame and electrically connecting the pressure sensor die to first leads of the lead frame with first bond wires. A pre-molded block of gel material is placed over an active region of the pressure sensor die, and then the pressure sensor die, the first bond wires, and at least part of the gel block are covered with a mold compound. In one embodiment, an upper surface of the gel block is flush with a top surface of the mold compound and exposed. In another embodiment, the upper surface of the gel block lies below the top surface of the mold compound. In yet another embodiment, a trench is formed around the gel block such that lateral side walls of the gel block are at least partially exposed.

The present invention allows a pressure sensor device to be formed without having to use a pre-molded lead frame. A mold pin is not required for forming a cavity over the pressure sensor die during the molding process. Further, only a predetermined (and limited) amount of gel material is required to assemble the device.

Referring now to FIG. 1A, a cross-sectional side view of a semiconductor pressure sensor device 10 in accordance with an embodiment of the present invention is shown. The semiconductor sensor device 10 comprises a lead frame having a plurality of leads 12 and at least a first die flag 14 surrounded by the leads 12. The lead frame is of a well-known type used in semiconductor device assembly and typically is formed from a sheet of copper or copper foil by stamping. The lead frame or parts thereof may be bare copper or plated such as with tin to prevent corrosion. The flag 14 may be in a plane that is parallel to but below a plane of the leads 12 (i.e., a down-set flag), but this is not a requirement of the present invention. Thus, lead frames where the flag and the leads are co-planar may also be used.

The device 10 may be a quad flat no-leads (QFN) type device, where the leads 12 are flush with lateral sides of the device, or a quad flat pack (QFP), where the leads 12 project from the lateral sides (as shown). However, other designs are also possible, for example where the leads 12 are bent downward so they have an exposed surface on a bottom side of the device 10.

A pressure sensor die 16 is attached to the flag 14 with a die attach material such as an adhesive or an adhesive tape, both of which are known in the art, and the die 16 is attached with an active surface thereof facing away from the flag 14. The pressure sensor die (a.k.a. P-cell) 16 is designed to sense ambient atmospheric pressure. First bond wires 18 electrically connect the pressure sensor die 16 with first ones of the lead frame leads 12. The bond wires 18 are formed from a conductive material such as aluminum, gold, or copper, and may be either coated or uncoated, as is known in the art, and attached using commercially available wire bonding equipment.

A cube-shaped pre-molded or pre-formed block of gel material 20 is disposed on and covers an active region of the pressure sensor die 16. The gel block comprises a low modulus material such as dimethyl silicone rubber, methyl vinyl silicone rubber, and methyl phenyl silicone rubber. An area of the gel block 20 is smaller than that of the pressure sensor die 16. The pre-molded block of gel material 20 is a type of typical low modulus material that is commonly used in the semiconductor packaging industry. A lower surface of the block of gel material 20 that is placed in contact with the surface of the die 16 is flat or follows the surface topography of the die 16. The block of gel material 20 is sized to be slightly larger than the sensitive area of the die 16, for example, the diaphragm of the pressure sensor. The other sides of the block of gel material 20 are typically flat but may be any shape that is more convenient for undergoing a pre-molding process and provide better reliability performance.

The block of gel material 20, as illustrated in FIG. 3A, is one shape that can be used to form the gel block 20. The process to form the gel block 20 is a typical molding process where the required amount of gel material is ejected into the molding tooling with the required shape followed by an in-line or stand-alone curing process. The thickness of the gel block 20 can range from about 0.1 mm to about 5 mm, which provides sufficient mechanical damage protection (i.e., protects the die) and sensitivity to pressure change. After the gel block 20 is cured, the gel block 20 is bonded to the surface of the die 16 using a typical die bonding process. An adhesive layer may be applied to the bottom surface of the gel block 20 or to the surface of the die 16. The adhesive may comprise an adhesive material that is typically used in semiconductor packaging. The pressure-sensitive gel material 20 enables the pressure of the ambient atmosphere to reach the active region of pressure sensor die 16, while protecting the die 16 from mechanical damage during assembly, and environmental damage (e.g., contamination and/or corrosion) when in use.

A mold compound 22 encapsulates the pressure sensor die 16, the first bond wires 18, and at least a portion of the gel block 20, as shown in the drawings. In the embodiment shown in FIG. 1A, a trench 24 is formed around the block of gel material 20. The trench 24 extends from the top surface of the mold compound 22 towards the active region of the pressure sensor die 16 such that a lower portion of the gel block 20 abuts the mold compound 22 while an upper portion of the gel block 20 is spaced from the mold compound 22, at least partially exposing the lateral sides of the gel block 20. In this embodiment, the upper surface of the gel block 20 lies below the upper surface of the mold compound 22 and a layer of the mold compound 22 covers the top surface of the gel block 20, where the top or outer exposed surface of the mold compound 22 lies in a plane— i.e., the mold compound on top of the gel block 20 is co-planar with the mold compound over the remaining top surface of the device 10.

Figure 1B:
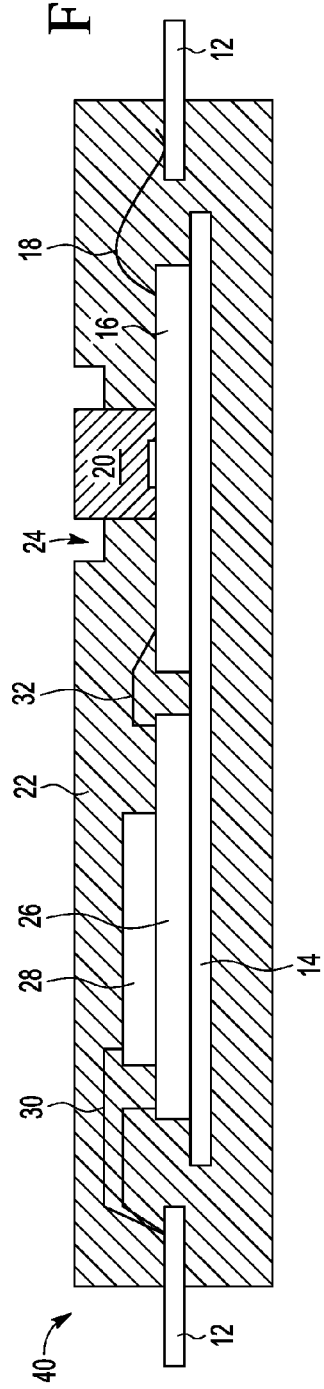

FIG. 1B shows an alternate embodiment of a device 40 in which an upper surface of the gel block 20 is flush with a top surface of the mold compound 22 and the upper surface of the gel block 20 is exposed to ambient atmospheric pressure outside the sensor device 10. That is, there is no layer of mold compound over the top surface of the gel block 20.

Figure 1C:
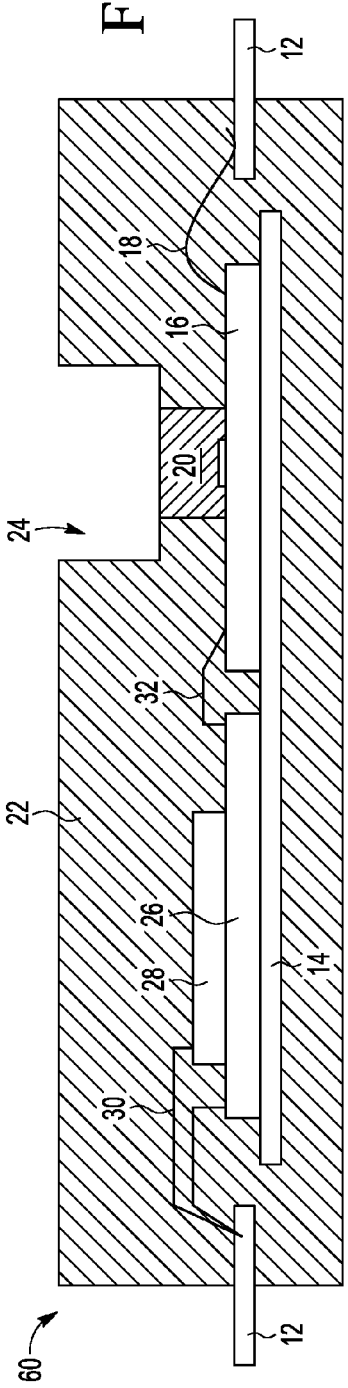
Figure 2:
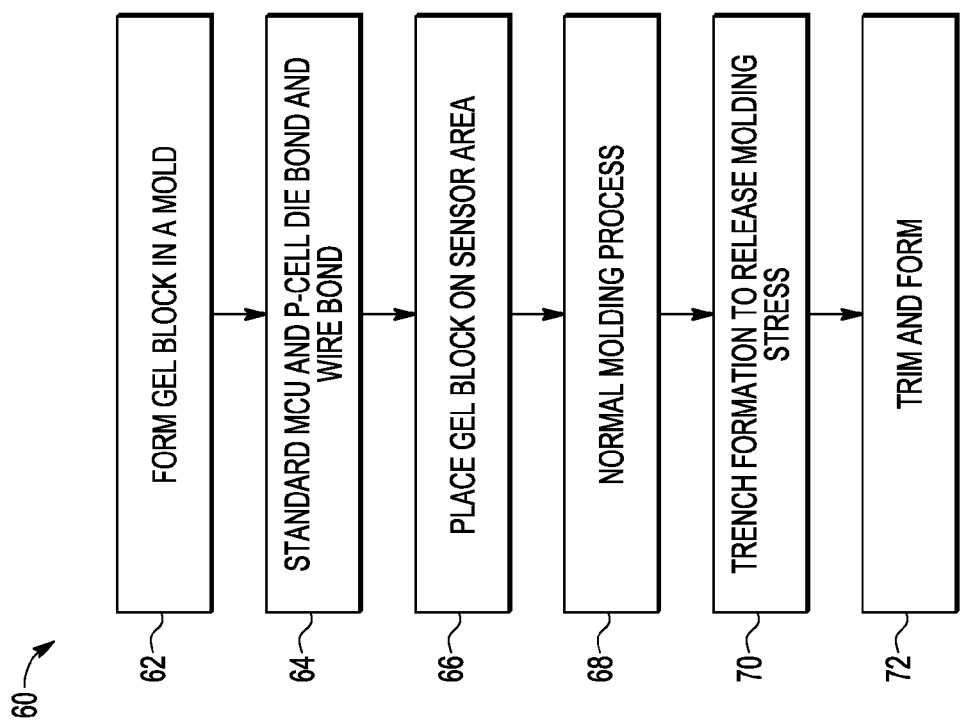
FIG. 2 is a flow chart of a method of assembling a pressure sensor device in accordance with an embodiment of the present invention.

FIG. 1C shows another alternate embodiment of a device 50 in which the upper surface of the gel block 20 is flush with a lower surface of the trench 24.

The sensor device 10, 40, 50 may further comprise at least one additional semiconductor integrated circuit die attached to the flag and electrically connected to the leads with bond wires and to the pressure sensor die with bond wires, where the additional semiconductor die and bond wires are covered with the mold compound 22. For example, as shown in FIGS. 1A, 1B and 1C, the devices 10, 40, 50 may include a control die 26 attached to the flag 14 adjacent to the pressure sensor die 16 and another sensor die 28 such as an accelerometer may be attached to an upper surface of the control die 26. Conventional, electrically insulating die-attach adhesive may be used to attach the control die 26 to the flag 14 and the other sensor die 28 to the control die 26. Those skilled in the art will understand that suitable alternative means, such as die-attach tape, may be used to attach some or all of these dies. The acceleration sensor die (a.k.a. G-cell) 28 is designed to sense gravity or acceleration in one, two, or all three axes, depending on the particular implementation. The control die 26 functions as the master control unit (MCU) for the P-cell 16 and the G-cell 28 by, for example, controlling the operations of and processing signals generated by the two sensor dies 16 and 28. The pressure sensor die 16, control die 26, and acceleration sensor die 28 are well known components of semiconductor sensor devices and thus detailed descriptions thereof are not necessary for a complete understanding of the disclosure. It also should be noted that, in alternative designs, the G-cell 28 can be electrically connected to the control die 26 using suitable flip-chip, solder-bump techniques instead of or in addition to wire-bonding.

The control die 26 and the additional sensor die 28 are electrically connected to the leads 12 with second bond wires 30, and the control die 26 may be connected to the pressure sensor die 16 with third bond wires 32. The control die 26, additional sensor die 28, the second bond wires 30 and the third bond wires 32 are covered with the mold compound 22.

Referring now to FIG. 2 and FIGS. 3A-3E, a flow chart 60 of a method of assembling a pressure sensor device in accordance with an embodiment of the present invention (FIG. 2), as well as illustrations of a device being assembled are shown (FIGS. 3A-3E). In a first step 62 (FIG. 2), a block of gel material 20 (FIG. 3A) is formed. The block of gel material 20 is formed from a pressure-sensitive gel material, such as a silicon-based gel. Examples of suitable pressure-sensitive gel material are available from Dow Corning Corporation of Midland, Mich. The block of gel material 20 is formed by dispensing the gel material into a mold form with a nozzle of a conventional dispensing machine, and then curing the gel material using an oven (heat) and/or UV irradiation. For example, the gel material may be cured at 150 to 175° C. for 120 to 240 minutes, depending on the size of the gel blocks being formed. In one embodiment, suitable gel blocks are cube shaped and have dimensions of 1.5×1.5×1 mm.

At step 62, as shown in FIG. 3B, a pressure sensor die 16 and a control die 26 are attached to a flag 14 of a lead frame (die attach), and electrically connected to leads 12 of the lead frame and each other, as the case may be, using bond wires 30 and 32 and commercially available wire bonding equipment. An additional sensor die, such as a G-cell 28 may be attached to a top surface of the control die 26 and electrically connected to the leads 12 with bond wires 30. The steps of attaching dies to a lead frame flag and electrically connecting the dies to leads (and each other) with bond wires is known in the art.

At step 64, and as shown in FIG. 3C, the pre-formed gel block 20 is placed over the active surface of the pressure sensor die 16 and, as previously discussed, may be attached to the surface of the die 16 using a die attach adhesive.

Figure 3D:
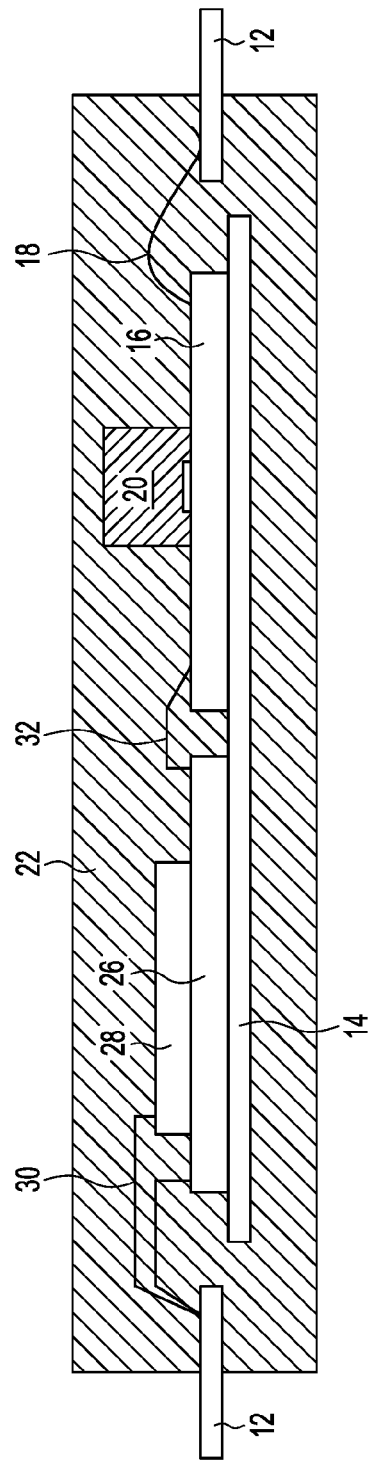

At step 68, the assembly from step 64 undergoes a molding process, where a mold compound 22 is formed over the dies 16, 26 and 28, the bond wires 30 and 32, the gel block 20, the lead frame flag 14, and part (or all) of the leads 12, as illustrated in FIG. 3D. The mold compound 22 may be a plastic, an epoxy, a silica-filled resin, a ceramic, a halide-free material, the like, or combinations thereof, as is known in the art, so long as it can provide mechanical protection of the dies and wire bonds yet not interfere with the operation of the pressure sensor. In this embodiment, the top of the gel block 20 also is covered with the mold compound 22.

Figure 3E:
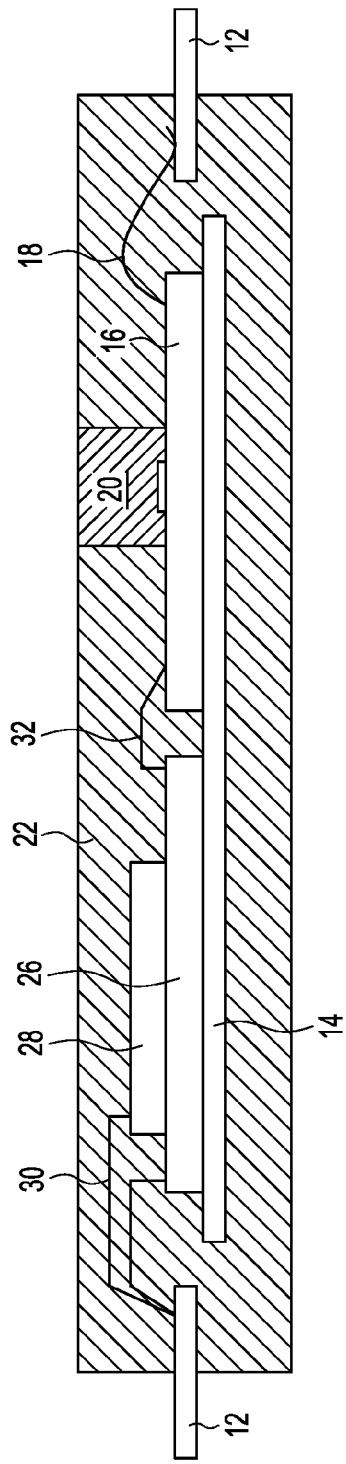

At step 70, as shown in FIG. 3E, a layer of the mold compound 22 is removed, such as by dry or wet etching or back-grinding to expose the top surface of the gel block 20 in order to release molding stress on the gel block 20. In other embodiments, a trench such as the trench 24 (FIG. 1A-1C) is formed in the mold compound 22 around the upper portion of the gel block 20. As previously discussed, the top of the gel block 20 may be covered with mold compound 22 or exposed to the air. The top surface of the gel block 22 also can be flush with the package top surface or lie below the top surface of the sensor device.

Finally, at step 72, conventional trim and form processes are performed. While the assembly shown in FIGS. 3C-3E has a bottom surface of the lead frame (leads 12 and flag 14) covered with the mold compound 22, it will be understood by those of skill in the art that these bottom surfaces could be exposed.

The sensor devices 10, 40, 50 can be manufactured with less cost than comparable sensor devices because only a pre-determined amount of the gel material is required and because a pre-molded lead frame is not required. The device also does not require a lid. Furthermore, the pressure sensor die 16 and the control die 26 can be electrically connected to the leads 12, and the G-cell 28 can be electrically connected to the control die and/or the leads 12 all in a single pass through a wire-bonding cycle (or in a single wire-bonding process step).

Although, not depicted in the drawings, in practice, a plurality of sensor devices are formed simultaneously using a lead frame sheet that has a two-dimensional array of the lead frames, and then the die bonding and wire bonding steps are performed on all of the lead frames in the array. Similarly, all of the devices are encapsulated with the molding compound at the same time too using a MAP (molded array process). After molding and exposing the gel block, the multiple sensor devices are separated, e.g., in a singulation process involving a saw or laser, to form individual instances of the sensor device.

As used herein, the term "mounted to" as in "a first die mounted to a lead frame" covers situations in which the first die is mounted directly to the lead frame with no other intervening dies (as in the mounting of pressure sensor 16 to lead frame in FIG. 3B) as well as situations in which the first die is directly mounted to another die, which is itself mounted directly to the lead frame (as in the mounting of the G-cell 28 to lead frame via the control die 26). Note that "mounted to" also covers situations in which there are two or more intervening dies between the first die and the lead frame.

Although the drawings show sensor devices 10, 40, 50 having a G-cell 28, those skilled in the art will understand that, in alternative embodiments, the G-cell 28 and its corresponding bond wires may be omitted. Further, although the drawings show embodiments in which a G-cell is mounted to a control die with the electrical interconnection provided by bond wires, those skilled in the art will understand that the electrical interconnection between such dies can, alternatively or additionally, be provided by appropriate flip-chip assembly techniques. According to these techniques, two semiconductor dies are electrically interconnected through flip-chip bumps attached to one of the semiconductor dies. The flip-chip bumps may include solder bumps, gold balls, molded studs, or combinations thereof. The bumps may be formed or placed on a semiconductor die using known techniques such as evaporation, electroplating, printing, jetting, stud bumping, and direct placement. The semiconductor die is flipped, and the bumps are aligned with corresponding contact pads of the other die.

By now it should be appreciated that there has been provided a packaged semiconductor sensor device and a method of forming the packaged semiconductor sensor device. The sensor can be used for various applications such as a Tire Pressure Monitoring System (TPMS). According to the invention, a pre-formed gel block is placed on top of a sensor area of a sensor die, and a trench is formed around an upper portion of the gel block. The present invention uses less gel material than conventional devices and thus provides a low cost solution. Furthermore, the invention decreases the opportunity for bubble formation.

Although the invention has been described using relative terms such as "front," "back," "top," "bottom," "over," "above," "under" and the like in the description and in the claims, such terms are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the disclosure is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A method for assembling a semiconductor sensor device, the method comprising:
   attaching a pressure sensor die to a flag of a lead frame;
   electrically connecting the pressure sensor die to first leads of the lead frame with first bond wires;
   placing a pre-molded block of gel material over an active region of the pressure sensor die; and
   encapsulating the pressure sensor die and the first bond wires with a mold compound, wherein the mold compound at least partially covers the block of gel material, wherein an upper surface of the block of gel material is flush with a top surface of the mold compound and exposed.

2. The method of claim 1, further comprising forming a trench around the gel block, wherein lateral sides of the gel block are at least partially exposed.

3. The method of claim 2, wherein the upper surface of the gel block lies below the top surface of the mold compound.

4. The method of claim 2, wherein a layer of the mold compound covers the upper surface of the gel block.

5. The method of claim 1, wherein the upper surface of the gel block is flush with a lower surface of the trench and the lateral sides of the gel block abut the mold compound.

6. The method of claim 1, further comprising:
   forming the gel block using a transfer molding process and a dedicated mold cavity matching the shape of the gel block; and
   attaching the gel block to the active region of the pressure sensor die with an adhesive.

* * * * *